United States Patent [19]

Crank

[11] Patent Number: 5,316,974

[45] Date of Patent: May 31, 1994

[54] INTEGRATED CIRCUIT COPPER METALLIZATION PROCESS USING A LIFT-OFF SEED LAYER AND A THICK-PLATED CONDUCTOR LAYER

[75] Inventor: Sue E. Crank, Coppell, Tex.

[73] Assignee: Texas Instruments Incorporated, Dallas, Tex.

[21] Appl. No.: 516,637

[22] Filed: Apr. 30, 1990

Related U.S. Application Data

[63] Continuation of Ser. No. 286,549, Dec. 19, 1988, abandoned.

[51] Int. Cl.$^5$ .............. H01L 21/00; H01L 21/02; H01L 21/44; H01L 21/48
[52] U.S. Cl. .................... 437/190; 437/189; 257/750; 257/751
[58] Field of Search ............. 437/187, 189, 190, 192, 437/195, 197, 198, 203; 357/65, 67, 71

[56] References Cited

U.S. PATENT DOCUMENTS

| 4,272,561 | 6/1981 | Rothman et al. | 437/189 |
| 4,352,716 | 10/1982 | Schaible et al. | 437/245 |
| 4,742,014 | 5/1988 | Hopper et al. | 437/192 |
| 4,767,724 | 8/1988 | Kim et al. | 437/195 |

FOREIGN PATENT DOCUMENTS

| 0131867 | 10/1979 | Japan | 437/190 |
| 0161285 | 12/1979 | Japan | 437/190 |
| 0029181 | 3/1980 | Japan | |
| 0053443 | 4/1980 | Japan | 437/189 |
| 0120150 | 9/1980 | Japan | 437/190 |
| 0074945 | 6/1981 | Japan | 437/190 |
| 0072352 | 5/1982 | Japan | 437/190 |
| 0241233 | 11/1985 | Japan | 437/190 |
| 0060240 | 3/1987 | Japan | 437/190 |
| 2112566 | 7/1983 | United Kingdom | 437/190 |

OTHER PUBLICATIONS

IBM Technical Disclosure Bulletin, vol. 31, No. 3, Aug., 1988, pp. 477–478.
Flinn, R., Engineering Materials and Their Applications, pp. 631–632 Houghton Mifflin Co., 1986.
Vossen, J., Thin Film Procsses, pp. 229–230, Academic Press, 1977.
Sze, S., VLSI Technology, pp. 270, 304–306, McGraw-Hill, 1983.
Colclaser, R., Microelectronics: Processing and Device Design, Wiley & Sons, 1980.

*Primary Examiner*—Brian E. Hearn
*Assistant Examiner*—B. Everhart
*Attorney, Agent, or Firm*—Ira S. Matsil; James C. Kesterson; Richard L. Donaldson

[57] ABSTRACT

An improved metallized structure (10) is formed from a copper seed layer (46) and a copper structure (48). Semiconductor devices to be connected (16–18) are covered by a conductive barrier layer (20). An oxide layer (28) is then deposited over the barrier layer (20) and patterned using standard photolithographic techniques and an anisotropic plasma etch. Vertical sidewalls (36–38) are formed by the etch and an HF deglaze. A seed layer (44–46) is then sputtered onto a photoresist layer (30) and the exposed barrier layer (20). After stripping the photoresist (30) and the seed layer (44) thereon, the copper structure (48) is electroplated over the remaining seed layer (46). The structure (48) thus formed has approximately vertical sidewalls (24–26) for improved contact with subsequent layers.

12 Claims, 2 Drawing Sheets

INTEGRATED CIRCUIT COPPER METALLIZATION PROCESS USING A LIFT-OFF SEED LAYER AND A THICK-PLATED CONDUCTOR LAYER

This is a continuation of application Ser. No. 07/286,549, filed Dec. 19, 1988 now abandoned.

TECHNICAL FIELD OF THE INVENTION

This invention relates in general to semiconductor devices, and in particular to a method for forming copper metallization on an integrated circuit or on an interconnect board for multi-chip packages.

BACKGROUND OF THE INVENTION

In the fabrication of semiconductor devices, several layers of metallization are built on top of each other separated by insulating layers- The metallization typically is formed by the deposition of aluminum. Aluminum is used rather than copper to form leads and other metallization structures on a semiconductor device despite the fact that copper has lower resistance than aluminum due to problems associated with the deposition and etching of copper. Specifically, when copper is etched, it does not form a volatile gas with the plasma to allow removal from the processing chamber. Once copper is etched, it tends to be redeposited either elsewhere on the semiconductor device or on the processing chamber itself. In either case, contamination by copper in unwanted locations can destroy the circuits being constructed.

In an attempt to obtain the benefits of copper and avoid the problems with copper etching, the use of a thin sputtered seed layer of copper followed by a thick plated conductor layer has been developed- The copper seed layer method comprises depositing over a plasma oxide a multi-layered structure comprising a conductive barrier layer, a seed layer and a third protective layer. A standard photoresist process forms patterns within the photoresist over the multilayered structure. Once the patterns have been formed within the photoresist, the third protective layer is removed by reactive ion etching with carbon tetrachloride. Once the third protective layer has been removed, copper may be electroplated onto the seed layer, followed by a solvent strip to remove the resist.

The electroplated copper device thus formed has negatively sloped sidewalls due to inaccuracies inherent with the photolithographic process. Nonvertical sidewalls may result in inconsistencies in further processing, which may damage the functioning of the device being formed. Additionally, a step of etching is required to remove that portion of the seed layer not covered by the electroplated copper and to isolate the plated leads. As previously stated above, etching copper allows the unwanted redeposition of the etched material.

Another method known as "lift-off" has been developed for metallization processing but has only been used with aluminum. In addition to the disadvantages previously stated above, aluminum does riot provide a structure with sufficiently fine lines or small enough pitch for the increasingly down-scaled devices that are currently being designed. Aluminum must also be deposited in relatively thick layers which can add to the overall dimensions of the device. Thus, there is a need for a method for forming a copper metallization device on integrated circuits that has vertical sidewalls and does not require the etching of copper.

SUMMARY OF THE INVENTION

The present invention disclosed herein comprises a method for forming a metallized structure on a semiconductor integrated circuit or on an interconnect board for multi-chip packages which eliminates or substantially reduces problems associated with prior copper metallization methods. The present invention allows the formation of a copper structure with approximately vertical sidewalls and avoids the unwanted redeposition inherent with copper etching.

In accordance with one aspect of the present invention, a metallized structure is formed on a semiconductor integrated circuit by first forming a conductive barrier over the semiconductor device. An oxide layer is then formed over the barrier, which is subsequently patterned using standard photolithographic processes. Once the patterns are formed through the photoresist, an anisotropic etch is used to transfer the pattern through the oxide layer to the conductive barrier layer. A seed layer of metal is then deposited over the remaining photoresist and over the exposed barrier layer. After removing the photoresist and the seed layer thereon, additional metal is electroplated over the seed layer to form the device.

In another aspect of the present invention, a conductive barrier layer of tantalum is deposited over a plasma oxide. The anisotropic etch comprises a fluorine-based etch, which is followed by an $O_2$ descumming and a hydrogen fluoride deglazing. Copper is electroplated on a copper seed layer in a copper sulphate solution using standard cathode-anode electroplating techniques.

It is a technical advantage of the present invention that the copper structure is formed with approximately vertical sidewalls, avoiding problems associated with nonvertical sidewall devices. It is a further technical advantage of the present invention that the problems associated with the etching of copper are eliminated.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE INVENTION

Figure 1:
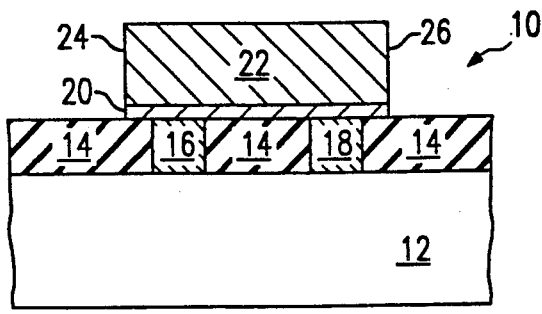
FIG. 1 is a cross-sectional view of a semiconductor structure formed in accordance with the preferred embodiment of the present invention.

In FIGS. 1-2, like items are identified by like and corresponding numerals for ease of reference. Referring to FIG. 1, a metallization structure formed in accordance with the preferred embodiment of the present invention is generally identified by the reference numeral 10. The structure 10 is formed over a silicon semiconductor substrate 12 having an oxide layer 14 formed thereon. Formed within the oxide 14 are, for example, a pair of tungsten plugged vias 16 and 18.

Formed over the oxide 14 to interconnect the plugged vias 16 and 18 is a relatively thin conductive barrier layer 20 which may comprise tantalum or titanium nitride. Over the conductive barrier layer 20 is a structure 22 comprising copper seed and electroplated copper, which will be subsequently described in greater detail. The structure 22 has approximately vertical sidewalls 24 and 26 resulting from the method of the present invention. The vertical sidewalls 24-26 provide better contact with subsequent layers which results in a device less likely to fail from voids therebetween.

Figure 2A:
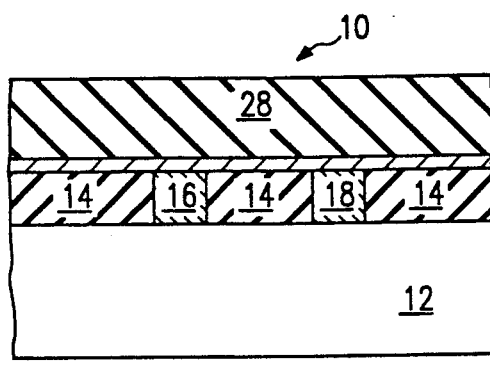
FIGS. 2a-2f are cross-sectional views of the step-by-step method in accordance with the preferred embodiment of the present invention.

FIGS. 2a-f illustrate the sequential formation of the device shown in FIG. 1. Referring to FIG. 2a, the substrate 12 has plugged vias 16 and 18 formed in the oxide layer 14 by suitable known conventional techniques. A conductive barrier layer 20, preferably comprising tantalum, is sputter deposited over the oxide 14 and the plugged vias 16 and 18. A second oxide layer 28 comprising a dielectric oxide or plasma oxide is formed over the layer 20 by plasma enhanced chemical vapor deposition to be at least as thick as the structure to be formed therein.

Figure 2B:
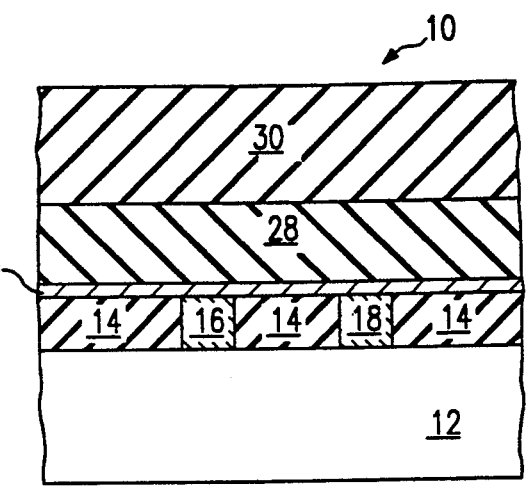

Referring to FIG. 2b, the oxide layer 28 is subsequently covered with a layer of photoresist 30. The photoresist 30 is then masked, using a reticle and standard photolithographic processes which are well known in the art to form a pattern therein.

Figure 2C:
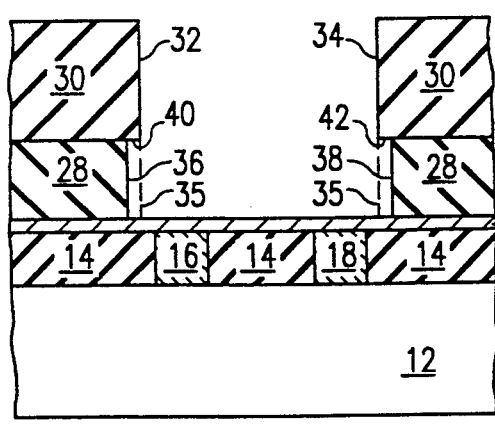

Referring to FIG. 2c, sidewalls 32 and 34 are formed in the resist 30 by the lithographic process. An anisotropic etch of the oxide layer 28 is performed using a fluorine-based oxide etchant, such as $C_2F_6/CHF_3$ in helium, which forms approximately vertical sidewalls (shown by dashed lines 35) therein. It is then preferable to perform an $O_2$ descum to remove any polymers left on the barrier layer 20 after the anisotropic etch. A short hydrogen fluoride (HF) deglaze should be performed to recess the plasma oxide layer 28 slightly under resist 30 to form approximately vertical sidewalls, 36-38 and overhangs 40-42. The overhangs 40 and 42 are preferable to inhibit creation of a continuous seed layer formation along sidewalls 36 and 38, as will be subsequently described in more detail.

Figure 2D:
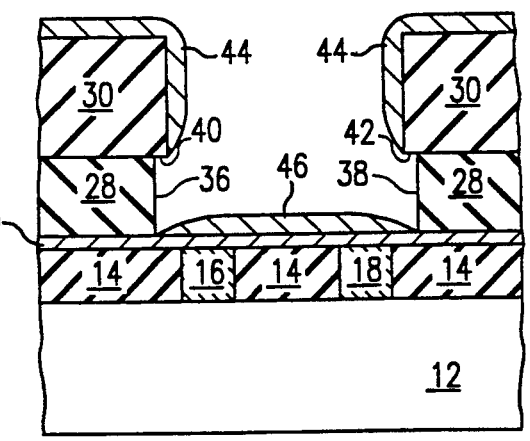

Referring to FIG. 2d, a seed layer 44-46 preferably comprising copper, is deposited by sauttering. The seed layer 44 covers the photoresist 30, the seed layer 46 covers the exposed conductive barrier layer 20 within the etched oxide 28. Due to the over-hangs 40-42 and the very thin application (target thickness of 1000 Angstroms) of the seed layer, no seed layer is deposited on the approximately vertical sidewalls 36 and 38 of the oxide layer 28 during the sputtering application.

Figure 2E:
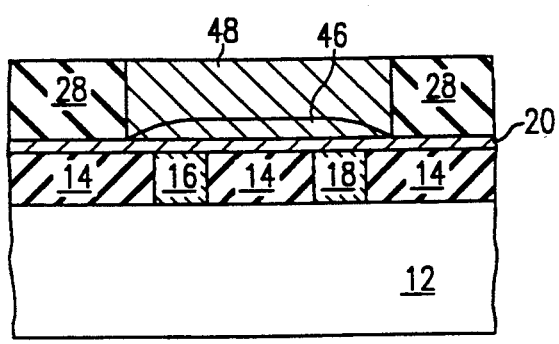

Referring to FIG. 2e, the photoresist 30 is then stripped, using a standard organic solvent stripper and ultrasonic agitation, which also removes the seed layer 44 thereon. A copper structure 48 is then formed over the seed layer 46 within the patterned plasma oxide layer 28, preferably using electroplating techniques well known in the art. One such electroplating technique comprises the use of a cathode (the wafer 12) and an anode comprising an acid and copper sulphate electrolyte solution.

Figure 2F:
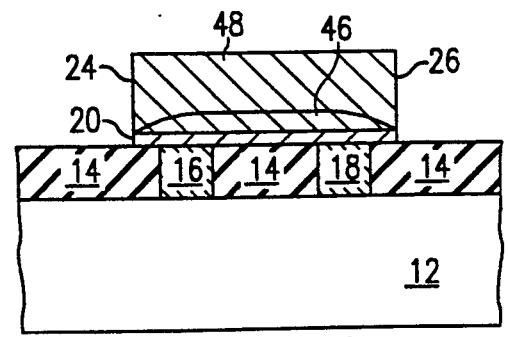

Referring to FIG. 2f, an anisotropic etch using a fluorine based oxide etchant is used to remove the oxide layer 28 from around the copper structure 48. The conductive barrier layer 20 not covered by the copper structure 48 is removed using a carbon tetrafluoride ($CF_4$) plasma etch. The copper structure 48 is thus formed with approximately vertical sidewalls 24 and 26 over the seed layer 46 and the conductive barrier layer 20. The structure 48 is not hampered by contaminants from a copper etch or from the non-vertical sidewalls of a photoresist pattern. The metallized structure 10 is thus superior to those formed in accordance with prior methods.

Figure 3:
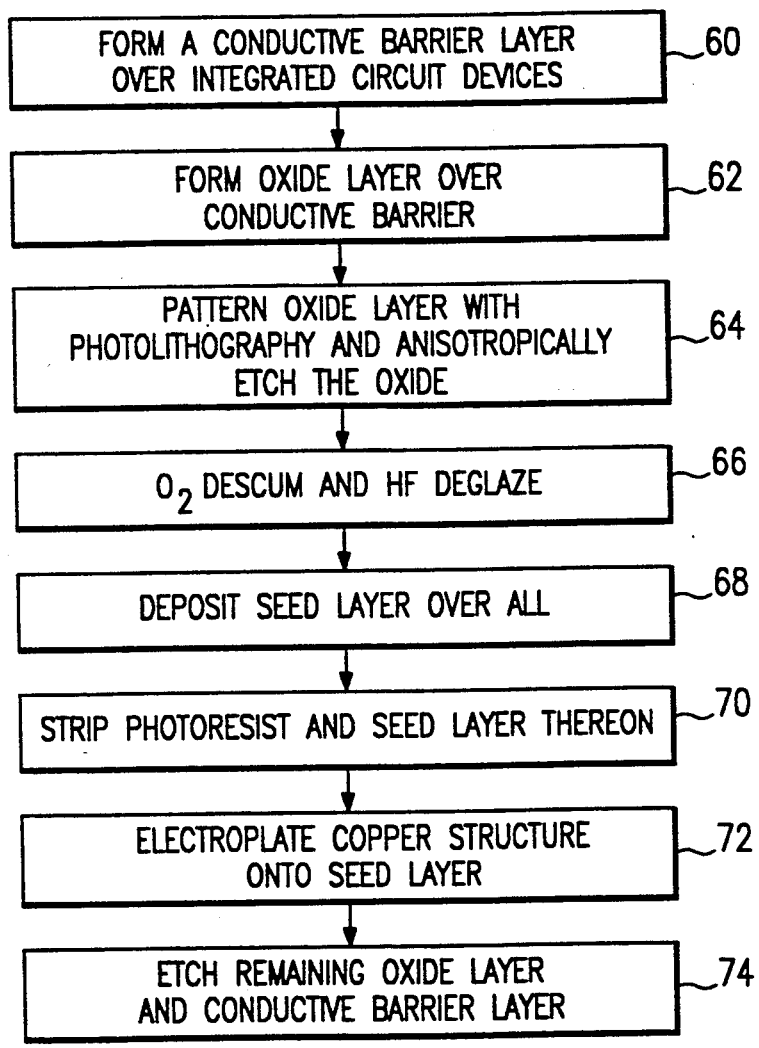
FIG. 3 is a flow chart of the method steps utilized in the preferred embodiment of the present invention.

FIG. 3 depicts a step-by-step application of the method in accordance with the present invention:

Step 1 at 60: Form a conductive barrier layer over the integrated circuit devices to be connected;

Step 2 at 62: Form an oxide layer over the conductive barrier;

Step 3 at 64: Pattern the oxide layer with photolithography and anisotropically etch the oxide layer;

Step 4 at 66: Perform an $O_2$ descum to remove any polymers and on HF deglaze to undercut the photoresist;

Step 5 at 68: Deposit a seed layer over the entire surface;

Step 6 at 70: Strip the photoresist and the seed layer thereon;

Step 7 at 72: Electroplate copper over the seed layer to form a copper structure; and Step 8 at 74: Etch the remaining oxide and conductive barrier layers.

Although not shown it is to be understood that the present invention can be used equally effectively on an interconnect board for multi-chip packages. Although the present invention has been described with respect to a specific preferred embodiment thereof, various changes and modifications may be suggested to one skilled in the art and it is intended that the present invention encompass such changes and modifications as fall within the scope of the appended claims.

What is claimed is:

1. A method for forming a conductive structure in an integrated circuit, comprising the steps of:
   forming a conductive barrier layer in conductive contact with components in a semiconductor substrate;
   forming an insulating layer on said barrier layer;
   forming a patterned layer on said insulating layer;
   etching said insulating layer using said patterned layer as an etch mask, said etching exposing a portion of said barrier layer;
   depositing a seed layer overall;
   removing said patterned layer, thereby removing the portion of said seed layer deposited on said patterned layer; and
   selectively forming a conductor on said seed layer.

2. A method as in claim 1 wherein said insulating layer comprises silicon dioxide.

3. A method as in claim 1 wherein said seed layer and said conductor layer comprise copper.

4. A method as in claim 1 wherein said barrier layer comprises tantalum.

5. A method as in claim 1 wherein said etching of said insulating layer etches a portion of said insulating layer beneath said patterned layer.

6. A method as in claim 1 wherein said patterned layer comprises photoresist and said patterned layer is patterned using photolithography.

7. A method for forming a conductive structure in an integrated circuit, comprising the steps of:
   forming a conductive barrier layer in conductive contact with components in a semiconductor substrate;
   forming an insulating layer on said barrier layer;

forming a patterned layer on said insulating layer;
etching said insulating layer using said patterned layer as an etch mask, said etching exposing a portion of said barrier layer;
depositing a seed layer overall;
removing said patterned layer, thereby removing the portion of said seed layer deposited on said patterned layer;
selectively forming a conductor on said seed layer;
removing said insulating layer after the formation of said conductor; and
etching said barrier layer using said conductor as an etch mask.

8. A method as in claim 7 wherein said insulating layer comprises silicon dioxide.

9. A method as in claim 7 wherein said seed layer and said conductor layer comprise copper.

10. A method as in claim 7 wherein said barrier layer comprises tantalum.

11. A method as in claim 7 wherein said etching of said insulating layer etches a portion of said insulating layer beneath said patterned layer.

12. A method as in claim 7 wherein said patterned layer comprises photoresist and said patterned layer is patterned using photolithography.

* * * * *